United States Patent
Peterson

(10) Patent No.: US 6,875,930 B2
(45) Date of Patent: Apr. 5, 2005

(54) OPTIMIZED CONDUCTOR ROUTING FOR MULTIPLE COMPONENTS ON A PRINTED CIRCUIT BOARD

(75) Inventor: Melvin Peterson, Campbell, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 476 days.

(21) Appl. No.: 10/125,287

(22) Filed: Apr. 18, 2002

(65) Prior Publication Data

US 2003/0198031 A1 Oct. 23, 2003

(51) Int. Cl.[7] .......................... H01R 12/04; H05K 1/11
(52) U.S. Cl. ...................... 174/261; 174/255; 361/777; 257/778
(58) Field of Search .................................. 174/261, 260, 174/262, 255; 361/760, 767, 775, 777, 792, 794; 29/832, 842, 846; 257/778, 773, 786

(56) References Cited

U.S. PATENT DOCUMENTS

| | | | |
|---|---|---|---|
| 5,012,389 A | * | 4/1991 | Perry ........................ 361/684 |
| 6,072,699 A | | 6/2000 | Horine |
| 6,111,205 A | | 8/2000 | Leddige et al. |
| 6,118,669 A | * | 9/2000 | Yee et al. .................... 361/777 |
| 6,118,670 A | | 9/2000 | Radford et al. |
| 6,194,668 B1 | * | 2/2001 | Horiuchi et al. ............ 174/261 |
| 6,229,099 B1 | | 5/2001 | Horiuchi et al. |
| 6,452,115 B2 | * | 9/2002 | Horiuchi et al. ............ 174/261 |
| 6,465,745 B1 | * | 10/2002 | Fontacha et al. ........... 174/260 |

* cited by examiner

*Primary Examiner*—Kamand Cuneo
*Assistant Examiner*—I B Patel

(57) ABSTRACT

A multilayered substrate includes a plurality of connection point groups, each including connection points. At least two inside conductors are each electrically coupled to inside connection points in at least two connection point groups, wherein each of the inside conductors is substantially equal in length between the inside connection points of adjacent connection point groups which is defined as a inside conductor length. At least two outside conductors are each electrically coupled to outside connection points in at least two connection point groups, wherein each of the outside conductors is substantially equal in length between the outside connection points of the adjacent connection point groups which is defined as an outside conductor length. The inside conductor length is shorter than the outside conductor length.

32 Claims, 4 Drawing Sheets

OPTIMIZED CONDUCTOR ROUTING FOR MULTIPLE COMPONENTS ON A PRINTED CIRCUIT BOARD

FIELD OF THE INVENTION

The present invention relates to conductor routing on a printed circuit board. More particularly, the present invention relates to a method and apparatus for routing conductors having matched lengths between multiple components on the printed circuit board.

BACKGROUND OF THE INVENTION

Many applications require components such as microprocessors and memory devices that use high speed busses to communicate. The microprocessors and memory devices are often mounted on substrates such as printed circuit boards and use conductors or traces on multiple layers to route the high speed busses. Microprocessors can have internal operating frequencies which extend into the gigahertz frequency range. Printed circuit board busses have not been able to latch data at these rates. A number of techniques have been employed to improve the rate of data communication on these busses. In one approach, data can be bussed at a higher transfer rate than addresses if the data is sent with an implied address sequence using a burst mode. In another approach, source synchronous busses have been employed to improve the rate of data communication. These buses use clocking signals, called strobes, which are generated by the sending agent and which are transmitted along with the data and address information. Data is latched on both the rising and falling edge of a strobe while addresses are latched only on the rising or only on the falling edge of the strobe. This approach effectively increases the data rate by a factor of two over the fundamental buss frequency. In yet another approach, two strobes are used wherein the strobes are out of phase with each other by 90° and the data is latched on both the rising and falling edge of each strobe. This approach effectively increases the data rate by a factor of four.

At these high frequencies and high data transfer rates, it can become a difficult challenge to design printed circuit boards which support this high level of performance. For example, high frequency signals can be reflected by variations in the impedance of the traces which can degrade the quality of the signals being transmitted. Use of sharp turns when routing the traces can introduce parasitic capacitive and inductive effects which result in reflections. Capacitive and inductive cross-coupling can occur between signal traces routed in close proximity. When traces are routed to connect to a package, the traces typically are narrower and closer together in the vicinity of the package. This is generally referred to as necking down, and is herein defined to be the distance over which the narrower and closer traces are routed. The traces are required to neckdown in order to contact and/or navigate the array of vias when under or in the immediate area of packages used to mount the components on the printed circuit board. If the neckdown distance is considerable, such as when traces are routed under the length of the package, the undesirable effects such as capacitive and inductive cross-coupling can become significant.

A variety of packages which include direct attach and surface mount socket types are used to mount the components on the printed circuit boards. For high pin-count devices such as microprocessors, ball grid array and pin grid array packages have become popular package types since they allow for a high number of terminals on each package. The terminals can be located over the entire bottom surface or a substantial portion of the package and typically employ a terminal footprint having a rectangular shape. FIG. 1 illustrates a bottom view of an exemplary 256 pin ball grid array package 50 and illustrates the interconnect density of solder balls 52 within the terminal footprint. The center to center distance (i.e. pitch) between the solder balls 52 is very small thus creating routing challenges when routing traces to avoid vias and other traces as they traverse from package to package. Pin grid array packages are essentially the same as ball grid array packages except that the pin grid array packages are mounted to the printed circuit board by inserting pins that extend from the bottom surface of the package into corresponding sockets on, or through holes in, the printed circuit board. The ball grid array and pin grid array packages generally have multiple power, ground and signal terminals. The signal terminals include data terminals, address terminals, clock/strobe terminals, control terminals, and other signal terminals. Buses are used to interconnect the data, address and clock/strobe terminals of the various packages. For example, data and address buses may be used with a source-synchronous signaling technique to connect several microprocessors and/or memory devices on printed circuit boards.

To overcome the challenges of routing printed circuit boards which support high frequencies and high data transfer rates when using packages having high interconnect densities, it is desirable to shorten the length of each trace used for synchronous bus routing to minimize the overall propagation delay between packages. It is often desirable to keep the length of each synchronous bus the same between packages and the propagation delay of each individual routed trace is the same within each source synchronous group. It is also desirable to minimize neckdown distance and to avoid routing traces with sharp turns when routing the traces to interconnect the package vias.

SUMMARY OF THE INVENTION

A multilayered substrate includes a plurality of connection point groups, each including connection points. At least two inside conductors are each electrically coupled to inside connection points in at least two connection point groups, wherein each of the inside conductors is substantially equal in length between the inside connection points of adjacent connection point groups which is defined as a inside conductor length. At least two outside conductors are each electrically coupled to outside connection points in at least two connection point groups, wherein each of the outside conductors is substantially equal in length between the outside connection points of the adjacent connection point groups which is defined as an outside conductor length. The inside conductor length is shorter than the outside conductor length.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
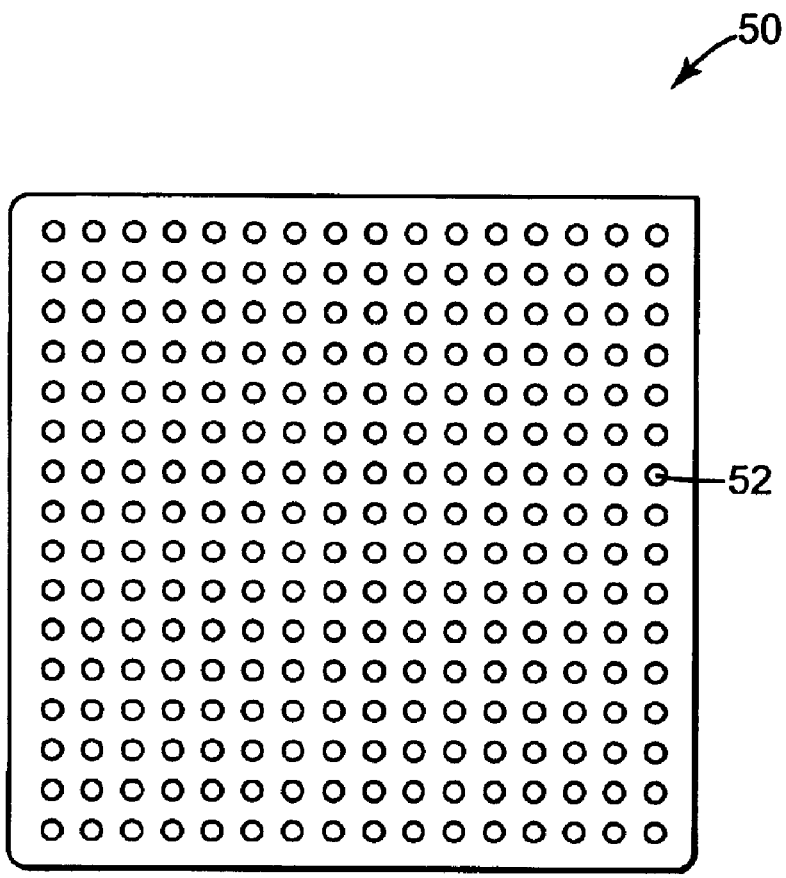
FIG. 1 illustrates a bottom view of an exemplary 256 pin ball grid array package.
Figure 2:
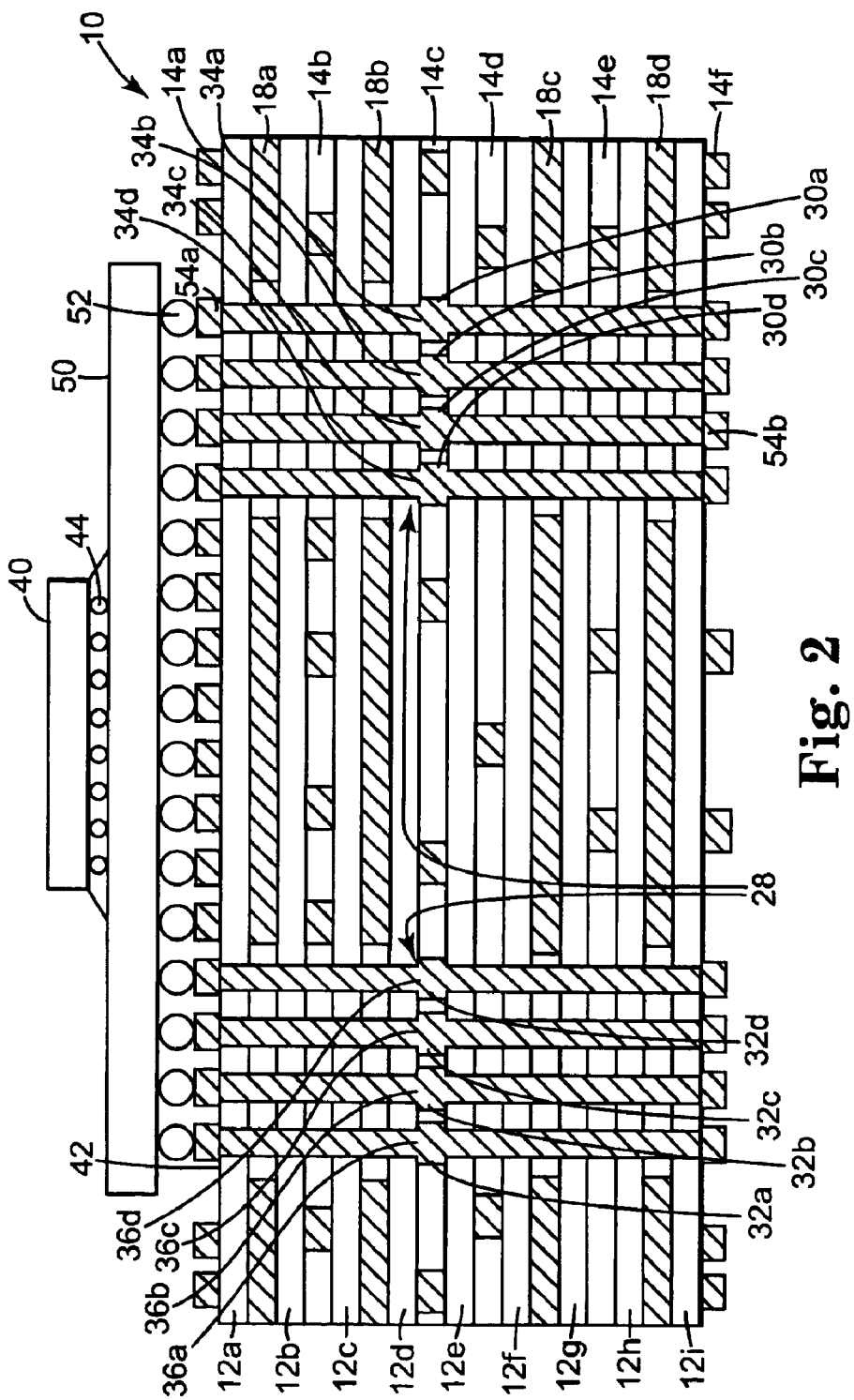
FIG. 2 is a cross-sectional view illustrating one exemplary embodiment of an integrated circuit packaged in a ball grid array package and mounted on the surface of a multilayered printed circuit board according to the present invention.

In the exemplary embodiment illustrated in FIG. 2, an integrated circuit 40 is packaged in a ball grid array package 50 and mounted on a surface 42 of a substrate which in the exemplary embodiment is a printed circuit board 10. Integrated circuit 40 is mounted via bumps 44 to ball grid array package 50. Ball grid array package 50 is mounted to pads 54a of printed circuit board 10 by using a high temperature reflow of solder balls 52. In alternative embodiments, ball grid array package 50 is mounted to pads 54b of printed circuit board 10 by using a high temperature reflow of solder balls 52. Ball grid array package 50 is electrically connected to trace layers 14 through vias 34 and 36. In various embodiments, integrated circuit 40 can be packaged in a variety of other package types which include, but are not limited to, dual inline packages, quad flat pack packages, and pin grid array packages. In still other embodiments, integrated circuit 40 is attached through a socket, either through hole or surface mount, which is mounted on the surface 42 of printed circuit board 10. The socket enables integrated circuit 40 upgrades without reworking printed circuit board 10.

In one embodiment, printed circuit board 10 is designed using a workstation which utilizes specialized computer aided design software to define the routing for individual layers. Once the design is complete, electronic design verification is performed to ensure the layer routing is designed as intended and to ensure all design specifications have been met. After verification is finished, the layers are manufactured by completing steps which include, but are not limited to, cleaning, photoresist deposition, photoresist exposure, developing, etching, photoresist stripping, inspection, oxide and testing. The layers are then combined into a multilayer printed circuit board 10 via a lamination process. The final manufacturing steps performed on the multilayer printed circuit board 10 include, but are not limited to, drilling, through-hole plating, cleaning, photoresist deposition, photoresist exposure, developing, plating, photoresist stripping, outer layer etching and tin stripping.

In the exemplary embodiment illustrated in FIG. 2, printed circuit board 10 is constructed of a number of layers which include insulating layers 12, trace layers 14 and conductive isolation layers 18. In one embodiment, insulating layers 12 are used to dielectrically isolate adjacent trace layers 14 and are formed from an epoxy laminate. Insulating layers 12 are illustrated in FIG. 2 as layers 12a through 12i.

In one embodiment, trace layers 14 are conductive and are alternately referred to as conductors 14. In one embodiment, the signals routed within trace layers 14 include, but are not limited to, data, address, clock and control. Trace layers 14 or conductors 14 are illustrated in FIG. 2 as layers 14a through 14f.

In one embodiment, isolation layers 18 are used to route power and ground planes which help reduce capacitive coupling and electromagnetic interference between trace layers 14. Isolation layers 18 are illustrated in FIG. 2 as layers 18a through 18d. In one embodiment, isolation layers 18a and 18d are ground planes and isolation layers 18b and 18c are power planes. In another embodiment, isolation layers 18a and 18d are power planes and isolation layers 18b and 18c are ground planes.

In the exemplary embodiment illustrated in FIG. 2, integrated circuit 40 is directly attached to surface 42 through ball grid array package 50 and is electrically connected to traces routed on a single trace layer 14c. In other embodiments, integrated circuit 40 is attached to surface 42 through a surface mount or through hole socket. These traces are illustrated as traces 30a through 30d and traces 32a through 32d. In the exemplary embodiment, traces 30 and traces 32 are routed in a direction perpendicular to the plane of FIG. 2. Traces 30 are electrically connected without stubs to connection points or vias 34 which are contained within a connection point group 28. Traces 32 are electrically connected without stubs to connection points or vias 36 within the same connection point group 28. In the illustrated embodiment, each connection point group 28 refers to a package footprint within which pins from ball grid array package 50 can couple to traces in trace layers 14.

To simplify the description of the present invention, only a limited number of solder balls 52 are shown. In various embodiments, ball grid array package 50 can have any suitable number of pins. Furthermore, only a limited number of traces within trace layers 14 are illustrated. In various embodiments, the number of traces routed can be any suitable number in order to route the package pins within the trace layers.

In various embodiments, printed circuit board 10 is constructed of a higher or lower number of layers which include insulating layers 12, trace layers 14 and isolation layers 18. Furthermore, in various embodiments, any suitable combination of insulating layers 12, trace layers 14 and isolation layers 18 are used to form printed circuit board 10.

Figure 3:
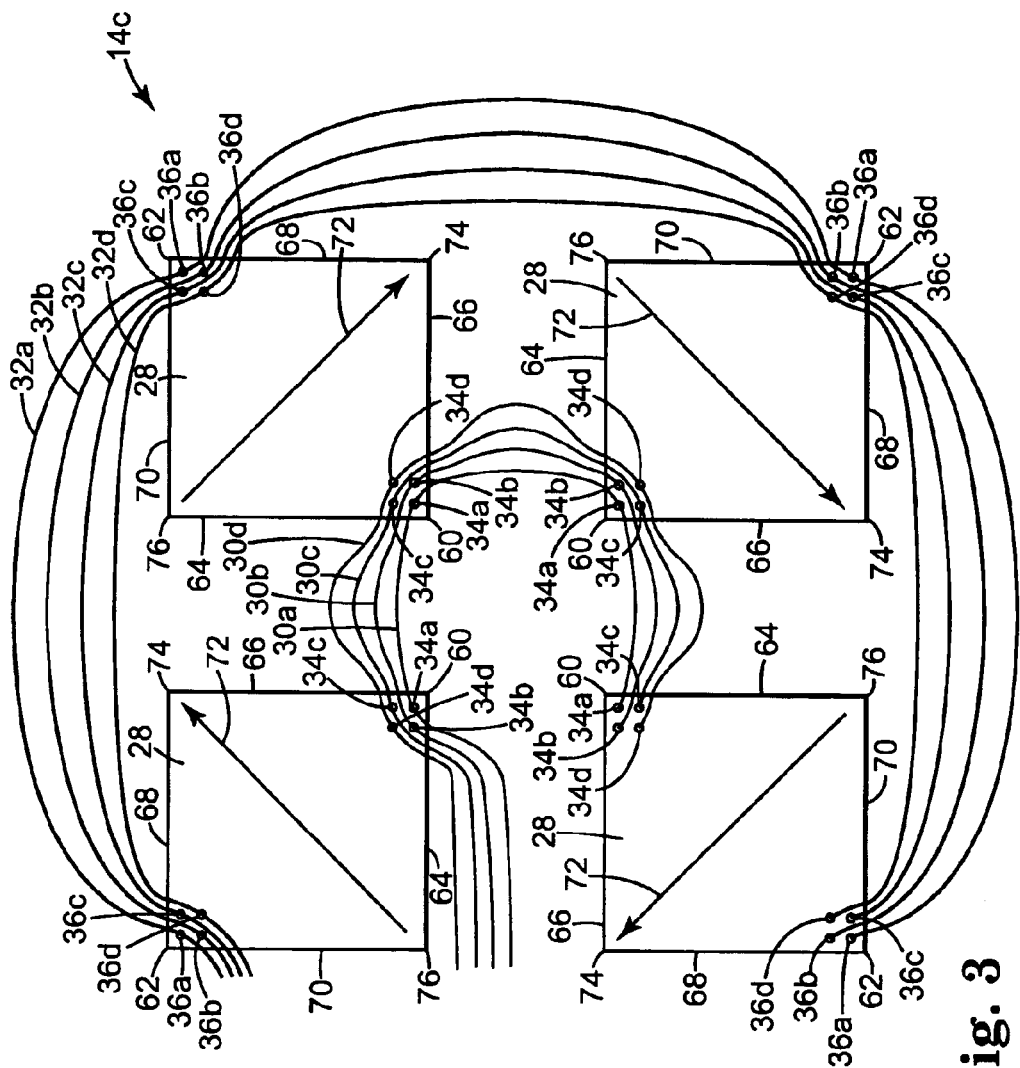
FIG. 3 is a top view illustrating a first exemplary embodiment of the placement and orientation of components and trace routing between connection point groups for a plurality of components mounted on a multilayer printed circuit board.

FIG. 3 is a top view illustrating a first exemplary embodiment of the placement and orientation of components and trace routing between connection point groups for a plurality of components mounted on a multilayer printed circuit board. FIG. 3 illustrates one embodiment of the present invention wherein at least two first traces or inside conductors 30 and at least two second traces or outside conductors 32 are routed between at least two connection point groups 28 within a single trace layer 14c in accordance with the present invention.

In one embodiment, each of the traces 30 is substantially equal in length between the first connection points or inside connection points 34 of adjacent connection point groups 28 which is defined as a first trace length or inside conductor length. Furthermore, each of the traces 32 is substantially equal in length between the second connection points or outside connection points 36 of adjacent connection point groups 28 which is defined as a second trace length or outside conductor length. The spacing between adjacent connection point groups 28 is referred to as a connection point group 28 to connection point group 28 spacing or as an agent to agent spacing.

In one embodiment, between adjacent connection point groups 28, the first trace length is shorter than the second trace length. Because traces 30 have a shorter length than traces 32, traces 30 will have less of a propagation delay than traces 32 and will be able to communicate signals more quickly. In one embodiment, traces 30 and 32 are routed between identical connection point groups 28 which are electrically connected to identical integrated circuits 40.

In one embodiment, the integrated circuits 40 are synchronous components. In one embodiment, traces 30 includes one bus group and traces 32 includes another bus group. In one embodiment, traces 30 includes data signals and strobe signals, and traces 32 includes address signals and strobe signals. Because the length of traces 30 is substantially equal between adjacent connection point groups 28 and the length of traces 32 is substantially equal between adjacent connection point groups 28, there is little skew between signals which maximizes the clock speeds which can be used. In the illustrated embodiment, both traces 30 and traces 32 are routed on the same trace layer 14 within printed circuit board 10. In various other embodiments, the traces 30 and 32 are routed on separate trace layers 14 within printed circuit board 10. In one embodiment, traces 30 are routed on trace layer 14$a$ while traces 32 are routed on trace layer 14$f$. While only two bus groups consisting of traces 30 and 32 are illustrated, in other embodiments, any suitable number of buses with any suitable number of traces may be used within each bus group as long as all the traces in a bus group are routed on the same layer.

In the exemplary embodiment illustrated in FIG. 3, traces 30 and 32 are routed in a symmetrical manner between each connection point group 28. That is, the connection points 34 and 36 within each connection point group 28 have the same configuration. Traces 30$a$ through 30$d$ each couple respectively to connection points 34$a$ through 34$d$ within each connection point group 28. Likewise, each trace 32$a$ through 32$d$ couples respectively to connection points 36$a$ through 36$d$ for each connection point group 28. In the illustrated embodiment, four connection point groups 28 are shown with traces being routed between connection point groups 28 in a symmetrical fashion. In other embodiments, there can be any suitable number of connection point groups 28.

In the exemplary embodiment illustrated in FIG. 3, each of the connection point groups 28 defines an area having a generally rectangular shape wherein the traces 30 are routed over a corner illustrated at 60. Each of the traces 32 are routed over an opposing corner illustrated at 62. Traces 30 are electrically connected to connection points 34 which are in close proximity to corner 60 and traces 32 are electrically connected to connection points 36 which are in close proximity to corner 62 in order to minimize what is referred to as "neckdown". Neckdown is where the space between traces on the same layer must be reduced in order to navigate the array of vias when under or in the immediate area of ball grid array package 50 in order to contact the package terminal or connection points and not interfere with each other. The center to center distance (i.e., pitch) between the array of connection points 34 or 36 is very small. When routed under the ball grid array package 50, the traces will necessarily be in close proximity as they must be routed to avoid connection points and other traces as they traverse from package to package. If the neckdown distance is considerable, undesirable effects such as capacitive cross-coupling can occur which degrades the performance of the system. Because the effects of cross-coupling in general increase with the length of the neckdown distance, it is desirable to minimize this distance. In one embodiment, traces 30 are routed without stubs to enter a first side of connection point group 28 illustrated at 64 and exit a second side of connection point group 28 illustrated at 66. Traces 32 are routed without stubs to enter a fourth side of connection point group 28 illustrated at 70 and exit a third side of connection point group 28 illustrated at 68. In the illustrated embodiment, each of the connection point groups 28 has a layout of connection points 34 and 36 which is the same as every other connection point group 28. In one embodiment, the connection points 34 and 36 are vias which electrically couple traces 30 and traces 32 from trace layer 14 to ball grid array package 50.

In the exemplary embodiment illustrated in FIG. 3, each connection point group 28 and corresponding ball grid array package 50 has a particular orientation. Arrow 72 indicates the direction of routing of traces 30 and traces 32 relative to the orientation of connection point groups 28 and the corresponding ball grid array package 50. As traces 30 and traces 32 are electrically connected to successive connection point groups 28, the orientation of connection point groups 28 rotates with the direction of routing as indicated by arrow 72. This is why between adjacent connection point groups 28, each trace 30 has a length which is shorter than the length of each trace 32. In one embodiment, arrow 72 is illustrated as extending between a corner 74 and an opposing corner 76. In one embodiment, traces 30 and 32 are routed to not cross over a line formed by arrow 72 between corners 74 and 76 in order to minimize the neckdown area of the routing of traces 30 and 32.

Although the exemplary embodiment illustrated in FIG. 3 applies to four connection point groups 28 and corresponding ball grid array packages 50, it is anticipated that any suitable number of connection point groups 28 can be used in accordance with the present invention. In one embodiment, as few as two or more than four connection point groups 28 are used in accordance with the present invention.

Figure 4:
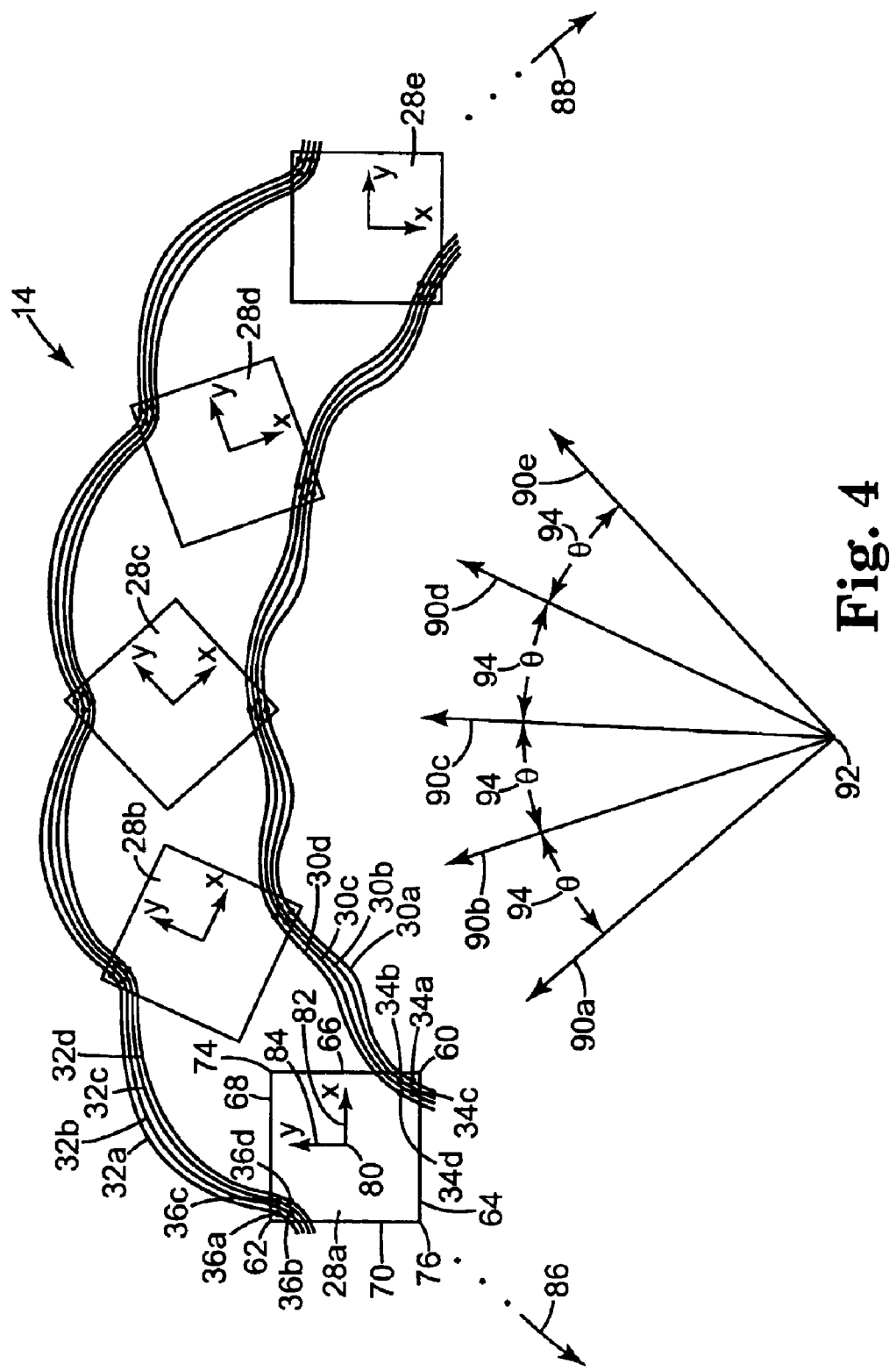
FIG. 4 is a top view illustrating a second exemplary embodiment of the placement and orientation of components and trace routing between connection point groups for a plurality of components mounted on a multilayer printed circuit board.

FIG. 4 is a top view illustrating a second exemplary embodiment of the placement and orientation of components and trace routing between connection point groups for a plurality of components mounted on a multilayer printed circuit board. In one embodiment, a plurality of connection point groups 28 each have a generally rectangular shape defined in a plane and have a center 80 at which coplanar orthogonal axes 82 and 84 intersect. In the illustrated embodiment, each connection point group 28 is rotated relative to the axes 82 and 84 of an adjacent connection point group 28. While five connection point groups 28$a$ through 28$e$ are illustrated, it is understood that as few as two connection point groups 28 or greater than five connection point groups 28 may be used in accordance with the present invention. This is illustrated by arrows 86 and 88 which indicate the direction of routing for inclusion of additional connection point groups 28. FIG. 4 illustrates at least two first traces or inside conductors 30 electrically coupled to first connection points or inside connection points 34, and at least two second traces or outside conductors 32 electrically coupled to second connection points or outside connection points 36. Traces 30 and 32 are each routed on a same trace routing layer 14 within printed circuit board 10. In various other embodiments, traces 30 and 32 are routed in different layers within printed circuit board 10.

In one embodiment, each of the traces 30 is substantially equal in length between the first connection points or inside connection points 34 of adjacent connection point groups 28 which is defined as a first trace length. Furthermore, each of the traces 32 is substantially equal in length between the second connection points or outside connection points 36 of adjacent connection point groups 28 which is defined as a second trace length. In one embodiment, between adjacent connection point groups 28, the first trace length is shorter than the second trace length. Because traces 30 have a shorter length than traces 32, traces 30 will have less of a propagation delay than traces 32 and will be able to communicate signals more quickly than traces 32. Thus, for example, trace 30a has the same length between connection points 34a of adjacent connection point groups 28a and 28b as the length of trace 30a between connection points 34a of adjacent connection point groups 28b and 28c, 28c and 28d, or 28d and 28e. Likewise, trace 32a has the same length between connection points 36a of adjacent connection point groups 28a and 28b as the length of trace 32a between connection points 36a of adjacent connection point groups 28b and 28c, 28c and 28d, or 28d and 28e. In one embodiment, traces 30 and 32 are routed between identical connection point groups 28 which are electrically connected to identical integrated circuits.

In one embodiment, traces 30 and 32 are synchronous bus groups. In one embodiment, traces 30 are a synchronous bus group which includes data lines and clock/strobe lines. In one embodiment, traces 32 are a synchronous bus group which includes address lines and clock/strobe lines. In one embodiment, the clock/strobe lines of traces 30 are independent of the clock/strobe lines of traces 32. In one embodiment, each synchronous component is electrically connected to a plurality of independently clocked synchronous bus groups. In one embodiment, a synchronous bus group consisting of traces 30 includes three data traces 30a, 30b, and 30c, and one clock trace 30d. A synchronous bus group consisting of traces 32 includes three address traces 32a, 32b and 32c and one clock trace 32d. Clock traces 30d and 32d may transmit different clock signals.

In one embodiment, traces 30 are a synchronous bus group which includes sixteen data signals (16 parallel data bits), two error bits, and two data strobe clocks. In one embodiment, there are four such data groups, wherein each data group is routed on a separate printed circuit board layer 14. In one embodiment, traces 32 are a synchronous bus group which includes two address groups routed on two printed circuit board layers 14. In various embodiments, traces for any number of groups may be routed on the same printed circuit board layer 14 if there is sufficient area.

In the second exemplary embodiment illustrated in FIG. 4, lines 90a through 90e each originate from a center point indicated at 92 and represent an axis which intersects corners 60 and 62 of the respective connection point groups 28. Each axis 90 is separated from an adjacent axis 90 by an angle θ indicated at 94. Thus, line 90a traverses corner 60 and 62 of connection point group 28a. In a likewise fashion, axes 90b through 90e respectively traverse corner points 60 and 62 of connection point groups 28b through 28e. In the illustrated embodiment, the angle θ at 94 is the same between adjacent connection point groups 28 to illustrate that the length of traces 30 between adjacent connection points 34 of adjacent connection point groups 28 is substantially equal. Furthermore, angle θ at 94 illustrates that the length of traces 32 between adjacent connection points 36 of adjacent connection point groups 28 is substantially equal, and that traces 32 have a length which is greater than the length of traces 30. This results because in the illustrated embodiment, the distance between center 92 and center 80 is the same for each connection point group 28. In other embodiments, additional connection point groups 28 are added in accordance with the present invention in the directions indicated by arrows 86 and/or 88, and are routed with traces 30 and 32 such that the sum of each angle θ between each adjacent connection point groups 28 does not exceed 360°.

In other embodiments, the distance between centers 92 and centers 80 for each connection point group 28 can vary. In these other embodiments, traces 30 are approximately the same length between adjacent connection points 34 of adjacent connection point groups 28 and traces 32 are approximately the same length between adjacent connection points 36 of adjacent connection point groups 28. In these other embodiments, traces 30 have a length between adjacent connection points 34 which is shorter than the length of traces 32 between adjacent connection points 36.

In one embodiment, traces 30 and traces 32 are routed without making sharp turns such as 90° turns to avoid discontinuities, reflections or parasitic effects. In other embodiments, it is anticipated that traces 30 and 32 incorporate 45° bends for ease of manufacturing. In one embodiment, traces 30 and 32 are routed as close as possible to corners 60 and 62, respectively, in order to reduce the neckdown of the traces within each connection point group 28.

In a variety of embodiments, the placement and orientation of connection point groups 28 are optimized for routing of high speed source-synchronous busses on traces 30 and 32 such that the highest speed bus groups can flow on the relatively short inside trace 30 track and thereby achieve shorter net lengths while maintaining equal trace 30 lengths between adjacent connection point groups 28, while slower speed buss groups can follow the longer outer trace 32 track which maintains equal trace 32 lengths between adjacent connection point groups 28.

In a variety of embodiments, the connection point groups 28 connect to integrated circuits 40 which are mounted on the same side of printed circuit board 10, on opposing sides of printed circuit board 10, or on both the same and opposite sides of printed circuit board 10. In various embodiments, the connection point groups 28 couple to ball grid array packages 50 which use a die up design having a continuous pattern of solder balls 52 to couple to connection point groups 28, or use a die down design having a "window frame" pattern of solder balls 52 to couple to connection point groups 28. In one embodiment, the die down design of ball grid array package 50 is used and the inside area of the window frame pattern is free of solder balls and traces 30 or 32 so that voltage supply decoupling capacitors can be mounted within the inside area. In other embodiments, other ball grid array packages 50 or other package types which have a window frame interconnect pattern are used and the voltage supply decoupling capacitors are mounted within the inside area of the window frame pattern.

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A multilayered substrate, comprising:
   a plurality of connection point groups, each including connection points;
   at least two inside conductors, each electrically coupled to inside connection points in at least two connection point groups, wherein each of the inside conductors is substantially equal in length between the inside connection points of adjacent connection point groups which is defined as a inside conductor length; and
   at least two outside conductors, each electrically coupled to outside connection points in at least two of the connection point groups, wherein each of the outside conductors is substantially equal in length between the outside connection points of the adjacent connection point groups which is defined as an outside conductor length, and wherein the inside conductor length is shorter than the outside conductor length.

2. The multilayered substrate of claim 1, wherein each of the connection point groups defines an area having a generally rectangular shape, wherein the inside conductors are routed over a corner of each of the connection point groups to the inside connection points positioned in proximity to the corner, and the outside conductors are routed over an opposing corner of each of the connection point groups to the outside connection points positioned in proximity to the opposing corner.

3. The multilayered substrate of claim 2, wherein the inside conductors are routed to enter a first side and exit a second side of each one of the connection point groups, and the outside conductors are routed to enter a fourth side and exit a third side of each one of the connection point groups.

4. The multilayered substrate of claim 2, wherein the inside conductors and the outside conductors are routed to not cross over a line which extends between an adjacent corner and an adjacent opposing corner of each one of the connection point groups.

5. The multilayered substrate of claim 1, wherein the inside conductors and the outside conductors are each routed on a same routing layer within the multilayered substrate.

6. The multilayered substrate of claim 1, wherein the inside conductors and the outside conductors are each routed on separate routing layers within the multilayered substrate.

7. The multilayered substrate of claim 1, wherein each of the connection point groups has a layout which is the same as every other one of the connection point groups.

8. The multilayered substrate of claim 1, wherein the inside connection points and the outside connection points are vias which electrically couple the inside conductors and the outside conductors to integrated circuits on a surface of the multilayered substrate.

9. A printed circuit board, comprising:
   a plurality of connection point groups, each including connection points, wherein the connection point groups each have a generally rectangular shape defining a plane and have a center at which coplanar orthogonal axes intersect, and wherein each connection point group is rotated relative to the axes of an adjacent connection point group;
   at least two first traces, each electrically coupled to first connection points in at least two connection point groups and routed on a single routing layer within the printed circuit board, wherein each of the first traces is routed to the first connection points located in close proximity to a corner of at least two connection point groups, wherein each of the first traces is substantially equal in length between the first connection points of adjacent connection point groups which is defined as a first trace length; and
   at least two second traces, each electrically coupled to second connection points in at least two connection point groups and routed on the single routing layer within the printed circuit board, wherein each of the second traces is routed to the second connection points located in close proximity to an opposing corner of at least two connection point groups, and wherein each of the second traces is substantially equal in length between the second connection points of the adjacent connection point groups which is defined as a second trace length.

10. The printed circuit board of claim 9, wherein the first traces are routed to enter a first side and exit a second side of each of the connection point groups, and the second traces are routed to enter a fourth side and exit a third side of each of the connection point groups.

11. The printed circuit board of claim 9, wherein each of the connection point groups has a layout which is the same as every other one of the connection point groups.

12. The printed circuit board of claim 9, wherein the inside and outside connection points are vias which electrically couple the first and second traces to integrated circuits mounted on a surface of the printed circuit board.

13. A printed circuit board, comprising:
   a plurality of connection point groups, each including connection points;
   inside means to electrically couple inside connection points of at least two connection point groups to have substantially equal length between the inside connection points of adjacent connection point groups which is defined as an inside conductor length; and
   outside means to electrically couple outside connection points of at least two of the connection point groups to have substantially equal length between the outside connection points of the adjacent connection point groups which is defined as an outside conductor length.

14. The printed circuit board of claim 13, wherein the inside means includes at least two inside conductors and the outside means includes at least two outside conductors.

15. The printed circuit board of claim 14, wherein the inside conductors and outside conductors are each routed on a same routing layer within the printed circuit board.

16. The printed circuit board of claim 13, wherein each of the connection point groups defines an area having a generally rectangular shape, wherein the inside conductors are routed over a corner of each of the connection point groups to the inside connection points positioned in proximity to the corner, and the outside conductors are routed over an opposing corner of each of the connection point groups to the outside connection points positioned in proximity to the opposing corner.

17. The printed circuit board of claim 16, wherein the inside conductors are routed to enter a first side and exit a second side of each one of the connection point groups, and the outside conductors are routed to enter a fourth side and exit a third side of each one of the connection point groups.

18. The printed circuit board of claim 13, wherein each of the connection point groups has a layout which is the same as every other one of the connection point groups.

19. The printed circuit board of claim 13, wherein the inside connection points and the outside connection points are vias which electrically couple the inside conductors and the outside conductors to integrated circuits mounted on a surface of the printed circuit board.

20. An electronic system, comprising:
- a plurality of integrated circuits mounted at a plurality of locations on a printed circuit board;
- a plurality of connection point groups, each including connection points, wherein each one of the plurality of integrated circuits is mounted on a surface of the printed circuit board and is electrically coupled to a corresponding one of the plurality of connection point groups;
- at least two first traces, each electrically coupled to first connection points in at least two connection point groups, wherein each of the first traces is substantially equal in length between the first connection points of adjacent connection point groups which is defined as a first trace length; and
- at least two second traces, each electrically coupled to second connection points in at least two connection point groups, wherein each of the second traces is substantially equal in length between the second connection points of the adjacent connection point groups which is defined as a second trace length, and wherein the first trace length is shorter than the second trace length.

21. The electronic system of claim 20, wherein each of the connection point groups defines an area having a generally rectangular shape, wherein the first traces are routed over a corner of each of the connection point groups to the first connection points positioned in proximity to the corner, and the second traces are routed over an opposing corner of each of the connection point groups to the second connection points positioned in proximity to the opposing corner.

22. The electronic system of claim 21, wherein the first traces are routed to enter a first side and exit a second side of each one of the connection point groups, and the second traces are routed to enter a fourth side and exit a third side of each one of the connection point groups.

23. The electronic system of claim 21, wherein the first traces and the second traces are routed to not cross over a line which extends between an adjacent corner and an adjacent opposing corner of each one of the connection point groups.

24. The electronic system of claim 20, wherein the first traces and the second traces are each routed on a same routing layer within the printed circuit board.

25. The electronic system of claim 20, wherein the first traces and the second traces are each routed on separate routing layers within the printed circuit board.

26. The electronic system of claim 20, wherein the integrated circuits are synchronous components.

27. The electronic system of claim 20, wherein the first traces include at least one synchronous bus and the second traces include at least one synchronous bus.

28. A method of routing signals on a printed circuit board, comprising:
- providing a plurality of connection point groups, each including connection points;
- routing at least two inside conductors to electrically couple to inside connection points in at least two connection point groups, wherein each of the inside conductors is substantially equal in length between the inside connection points of adjacent connection point groups which is defined as an inside conductor length; and
- routing at least two outside conductors to electrically couple to outside connection points in at least two connection point groups, wherein each of the outside conductors is substantially equal in length between the outside connection points of the adjacent connection point groups which is defined as an outside conductor length, and wherein the inside conductor length is routed to be shorter than the outside conductor length.

29. The method of claim 28, wherein the method further includes each of the connection point groups defining an area having a generally rectangular shape, wherein the inside conductors are routed over a corner of each of the connection point groups to the inside connection points positioned in proximity to the corner, and the outside conductors are routed over an opposing corner of each of the connection point groups to the outside connection points positioned in proximity to the opposing corner.

30. The method of claim 29, wherein the method further comprises the inside conductors being routed to enter a first side and exit a second side of each one of the connection point groups, and the outside conductors being routed to enter a fourth side and exit a third side of each one of the connection point groups.

31. The method of claim 28, wherein the method further comprises the inside conductors and the outside conductors being routed on a same routing layer within the printed circuit board.

32. The method of claim 28, wherein the method further comprises the inside conductors and the outside conductors being routed on separate routing layers within the printed circuit board.

* * * * *